(12) United States Patent
Wu

(10) Patent No.: US 9,324,966 B2
(45) Date of Patent: Apr. 26, 2016

(54) THIN-FILM TRANSPARENT CONDUCTIVE STRUCTURE AND DEVICES MADE THEREWITH

(71) Applicant: E I DU PONT DE NEMOURS AND COMPANY, Wilmington, DE (US)

(72) Inventor: Wei Wu, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 95 days.

(21) Appl. No.: 13/833,161

(22) Filed: Mar. 15, 2013

(65) Prior Publication Data

US 2014/0261656 A1    Sep. 18, 2014

(51) Int. Cl.
*H01L 31/0224*    (2006.01)
*H01L 51/52*    (2006.01)
*H01L 31/18*    (2006.01)

(52) U.S. Cl.
CPC ........ *H01L 51/5225* (2013.01); *H01L 31/1884* (2013.01); *H01L 51/5209* (2013.01); *H01L 51/5234* (2013.01); *Y10T 428/12361* (2015.01); *Y10T 428/24331* (2015.01)

(58) Field of Classification Search
USPC .................................................. 136/244–265
See application file for complete search history.

(56) References Cited

U.S. PATENT DOCUMENTS

| | | |
|---|---|---|
| 6,441,298 B1 | 8/2002 | Thio |
| 7,018,944 B1 | 3/2006 | Carnahan |
| 7,029,592 B2 | 4/2006 | Frendt |
| 7,989,254 B2 | 8/2011 | Yoon |
| 8,039,292 B2 | 10/2011 | Guha et al. |
| 2011/0149214 A1 | 6/2011 | Yoon |
| 2011/0284073 A1 | 11/2011 | Guha et al. |
| 2012/0006377 A1* | 1/2012 | Kim et al. ..................... 136/244 |
| 2012/0192936 A1 | 8/2012 | Girt et al. |
| 2013/0059232 A1 | 3/2013 | Jung et al. |
| 2013/0319522 A1 | 12/2013 | Koike et al. |
| 2013/0320322 A1 | 12/2013 | Muto et al. |

FOREIGN PATENT DOCUMENTS

| | | | |
|---|---|---|---|
| JP | WO 2012/093530 | * | 7/2012 |
| JP | EP 2 662 865 | * | 11/2013 |
| WO | 2012001424 A1 | | 1/2012 |

(Continued)

OTHER PUBLICATIONS

Van De Groep, Jorik et al., Transparent Conducting Silver Nanowire Networks, Nano Letters, 2012, pp. 3138-3144, vol. 12.

(Continued)

*Primary Examiner* — Jayne Mershon

(57) ABSTRACT

A transparent conductive structure useful in the fabrication of electrical, electronic, and optoelectronic devices is provided by a mesh-like metallic structure in the form of a thin film having a plurality of apertures, e.g. one having an average size of 250 nm to 425 nm as measured in the largest dimension and an average nearest-neighbor spacing of 300 nm to 450 nm. In another aspect, the metallic thin film has plural sublayers of different metals, and may have apertures up to 2 μm in size and an average nearest-neighbor spacing of up to 2.5 μm. The metallic thin film may be 20 to 200 nm thick, and may be formed on a flexible or rigid substrate or on a device itself. The structure exhibits a transparency enhanced over a value determined simply by the fraction of the area of the metallic film occupied by the apertures.

18 Claims, 16 Drawing Sheets

(56) References Cited

FOREIGN PATENT DOCUMENTS

| WO | 2012077738 A1 | 6/2012 |
|---|---|---|
| WO | 2012093530 A1 | 7/2012 |

OTHER PUBLICATIONS

Kang, Myung-Gyu et al., Toward Low-Cost, High-Efficiency, and Scalable Organic Solar Cells with Transparent Metal Electrode and Improved Domain Morphology, IEEE Journal of Selected Topics in Quantum Electronics, Nov./Dec. 2010, pp. 1807-1820, vol. 16, No. 6.

Luhman, Wade A. et al., Self-assembled plasmonic electrodes for high-performance organic photovoltaic cells, Applied Physics Letters, 2011, pp. 1-3, vol. 99.

Ho, Yu-Hsuan et al., Transparent and conductive metallic electrodes fabricated by using nanosphere lithography, Organic Electronics, 2011, pp. 961-965, vol. 12.

Zhu, J. F. et al., Enhanced Broadband Optical Transmission Through Ultrathin Metallic Nanomesh, Journal of Electromagnetic Waves and Applications, 2012, pp. 342-352.

International Search Report dated Aug. 12, 2014, International Application No. PCT/US2014/028843.

Ebbesen, T. W., et al., Extraordinary optical transmission through sub-wavelength hole arrays, Nature, 1998, 667-669, vol. 391.

Laux, E., et al., Enhanced optical transmission at the cutoff transition, Optics Express, 2009, 6920-6930, vol. 17, No. 9.

Sun, Tianyi, et al., Enhanced broad-band extraordinary optical transmission through subwavelength perforated metallic films on strongly polarizable substrates, Applied Physics Letters, 2013, 101114-1-101114-4, 102.

Van Der Molen, K. L., et al., Influence of hole size on the extraordinary transmission through subwavelength hole arrays, 2004, 4316-4318, vol. 85, No. 19.

Wu, Wei, et al., A broadband plasmonic enhanced transparent conductor, Nanoscale, 2014, 7811-7816, 6.

PCT International Preliminary Report on Patentability for International application No. PCT/US2014/028843, dated Sep. 24, 2015.

\* cited by examiner

THIN-FILM TRANSPARENT CONDUCTIVE STRUCTURE AND DEVICES MADE THEREWITH

FIELD OF THE INVENTION

The present invention relates to a transparent conductor useful in the construction of a variety of electrical, electronic, and optoelectronic devices.

TECHNICAL BACKGROUND OF THE INVENTION

Many electrical, electronic, and optoelectronic devices employ an electrode covering some portion of a generally two-dimensional surface of the device through which light enters or exits during the ordinary and intended operation of the device. Ideally, the electrode provides a means of making perfect electrical connection to the device while not inhibiting the transmission of light either into or out of the device.

For example, light incident on the light-receiving side of a photovoltaic device must be allowed to pass to the device's p-n junction to generate current. To carry out its intended function, the device in turn must be connected through an electrode structure to an external load that is appointed to be energized.

Other devices emit light in their expected and ordinary function. For example, input electrical energy is converted to light by a semiconductor or similar structure that is an integral part of devices such organic light-emitting devices or displays (OLEDs), touch screen panels, flat-panel displays, and various forms of solid state lighting. The light must be produced and delivered efficiently to the external world.

In most such devices, the incident or emitted light must pass through a substantial part of a surface of the device, which is nominally planar and two-dimensional, but may also be curved to some degree. Typically, the electrode structure must make contact throughout this area. A thick metallization layer covering most or all of a device's surface may afford high conductivity, but it provides no transparency through the covered area. Therefore, other expedients are essential. One approach relies on a high conductivity, thick material that covers only a small portion of the functional surface. Alternatively, most or all of the functional surface may be covered with a material that is inherently conductive but also transparent.

For example, a common electrode structure for the front (light-receiving) side of a photovoltaic cell is made by screen-printing a paste containing metallic silver particles in a pattern of thin, connected traces. The paste ordinarily is fired to sinter the silver particles. A typical configuration features a comb-like structure comprising a central large bus bar, with a large number of thin traces that branch off. The traces may be 10-20 µm thick and 50-150 µm wide, and are fully opaque. The currents collected by the individual traces join and flow through the bus bar, which is appointed in turn to be connected to one side of an external electric load. The inherently high conductivity of the silver used in the traces promotes a high conductivity, which desirably reduces the effective source resistance of the cell and the resulting ohmic loss produced by current flowing from the cell. However, the traces and bus bar cover a finite but measurable part of the overall cell area, thereby reducing the efficiency of the cell, since the shadowed areas cannot generate photoelectricity.

While extremely thin layers of metals do transmit light to some degree, their conductance at such a thickness is too low for virtually all practical optoelectronic devices. Thus, an alternate approach is taken for devices such as OLEDs in touch screen panels, flat-panel displays, and solid state lighting. Ordinarily, the configuration of these devices demands a uniform conducting layer that cannot be satisfied with a patterned metallization such as that described above for ordinary photovoltaic cells.

Heretofore, a conventional expedient has been the use of transparent conductive oxides, most commonly indium-tin-oxide (ITO), although aluminum-doped zinc oxide (AZO) and fluorine-doped tin oxide (FTO) are also possible. These oxides can be applied over the whole surface of a device. For a suitably chosen thickness (often in the range of 100 nm-300 nm), they have conductivity and transparency that are workable for many applications. However, depositing ITO requires a complicated fabrication with expensive equipment. Over time, indium can migrate into adjacent active material, potentially degrading performance. Furthermore, indium is a relatively rare and expensive element.

Another detriment is that ITO and similar conductive oxides still have conductivities that are substantially lower than those of highly conducting metals like Ag, Cu, and Al. In principle, increasing the thickness of the oxide layer should increase sheet conductance (or equivalently, decrease the sheet resistance). But in typical practice, the expected enhancement in sheet conductance is not realized, because of microcracking and other like microstructural defects. The same mechanical phenomena are also manifested in the materials' brittleness and inflexibility, impeding their use in flexible devices which are increasingly desired. Increased thickness also leads to an undesirable degradation of the layer's optical transparency.

Consequently, there remains a need in the art for transparent, conductive materials and structures that may be employed in the construction of reliable, efficient optoelectronic devices.

SUMMARY OF THE INVENTION

An embodiment of the invention relates to a thin-film transparent conductive structure comprising:
(a) a substrate; and
(b) a metallic layer disposed on the substrate and having therein an array of a plurality of apertures having an average size of 250 nm to 425 nm as measured in the largest dimension and an average nearest-neighbor spacing of 300 nm to 450 nm.

Another aspect provides a thin-film transparent conductive structure comprising:
(a) a substrate; and
(b) a metallic layer disposed on the substrate and having therein an array of a plurality of apertures having an average size of 250 nm to 2 µm as measured in the largest dimension and an average nearest-neighbor spacing of 300 nm to 2.5 µm, the metallic layer comprising a plurality of metallic sublayers, each being composed of a metal selected from the group consisting of Ag, Cu, Ni, Au, Ti, Cr, Al, and mixtures and alloys thereof.

Further, there is provided a process for forming a thin-film transparent conductive structure having a plurality of apertures on a substrate, the process comprising the steps of:
(a) providing a substrate having a first major surface;
(b) securing a plurality of beads on the first major surface of the substrate to form an array on the first major substrate;
(c) depositing a metal layer onto the first major surface and the beads; and
(d) removing the beads, whereby the apertures are formed.

The present thin-film transparent conductive structure is useful in the construction of a variety of electrical, electronic, and optoelectronic devices, of which photovoltaic cells, organic light emitting devices (OLED), and sensors of various types are representative.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

DETAILED DESCRIPTION OF THE INVENTION

Figure 1:
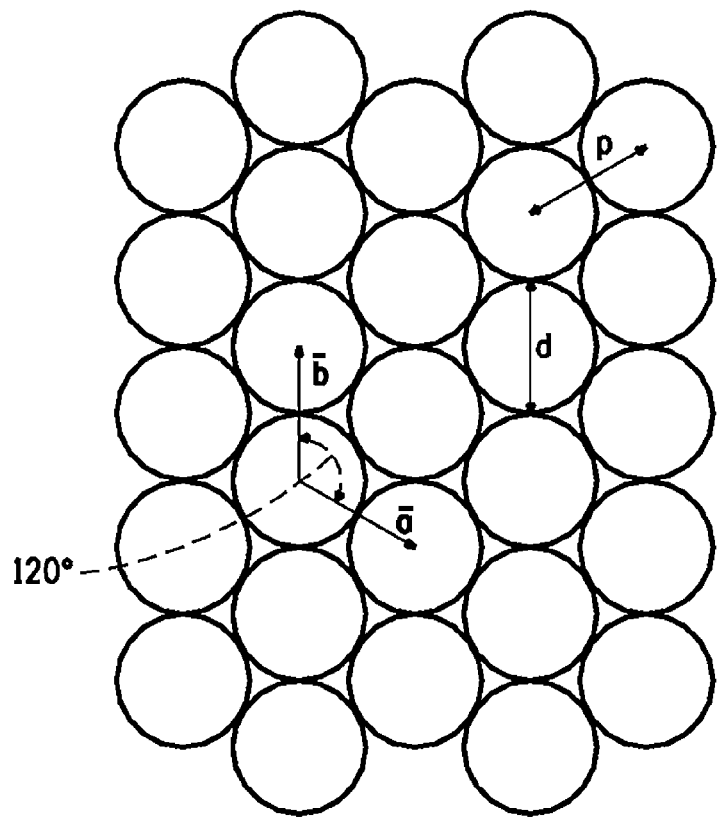
FIGS. 1-4 depict various thin-film transparent conductive structures in accordance with the present disclosure.

The present invention addresses the need for conductive, transparent materials that may be employed in fabricating optoelectronic devices and electrodes used therein.

An aspect of the disclosure provides a thin-film transparent conductive structure based on a patterned thin metal layer. In an embodiment, the structure exhibits both good electrical conductivity and good transparency for visible light. As used herein, the term "visible light" refers to electromagnetic radiation that is directly perceptible by ordinary human vision, here understood to be radiation having a wavelength in the range of about 400-700 nm. A skilled person will recognize that variations of the materials, structure, and techniques disclosed herein can be applied to create structures that exhibit good transparency for electromagnetic radiation of other wavelengths, particularly infrared (IR) and/or ultraviolet (UV) radiation that falls outside the strict limits of visible range, such as IR wavelengths as long as 1 mm and UV wavelengths down to about 300 nm. The skilled person will further recognize that elements and structures known in geometrical optics and typically employed in devices operable with visible light, such as lenses, mirrors, gratings, fibers, and the like, are also applicable to devices operating in the foregoing extended IR and UV wavelength ranges.

Further aspects provide an electronic device comprising such a thin-film transparent conductive structure and processes for fabricating the structure.

In an implementation, the present thin-film transparent conductive structure employs a thin conductive metal film that is mesh-like and includes apertures or other like small perforations that comprise a fraction of the conductive structure's overall area. Although apertures that are approximately circular in shape are conveniently formed and employed, apertures having other shapes, including without limitation polygonal, ellipsoidal, or irregular shapes, may also be employed. The metal film typically comprises at least one of Ag, Cu, Ni, Au, Ti, Cr, or Al, or a mixture or alloy thereof. Preferred metals for the metallization layer include Ag, Cu, Au, and Al.

In some embodiments, the metallic film in the non-aperture areas is sufficiently thick that little or no light would penetrate it, absent the presence of apertures. Surprisingly, some embodiments of the thin-film transparent conductive structure exhibit enhanced transmission, meaning that the fraction of the desired electromagnetic radiation incident on the structure that is transmitted is greater than the fractional area of the structure encompassed by the apertures, herein termed the "areal filling fraction." In various embodiments, the present thin-film transparent conductive structure may exhibit enhanced transmission either at a single wavelength or over a range of wavelengths. The term "average transmission" is used herein to refer to transmission over a specified range of wavelengths from a first wavelength $\lambda_1$ to a second wavelength $\lambda_2$, calculated using the following formula:

$$T_{avg} = \frac{\int_{\lambda_1}^{\lambda_2} T(\lambda) \frac{\hbar c}{\lambda} d\lambda}{\int_{\lambda_1}^{\lambda_2} \frac{\hbar c}{\lambda} d\lambda} \quad (1)$$

wherein $T(\lambda)$ is the fractional transmission at wavelength $\lambda$, $\hbar$ is Planck's constant, and c is the speed of light. For example, an average visible light transmission may be calculated using formula (1) with the limits $\lambda_1=400$ nm and $\lambda_2=700$ nm. The existence of enhanced transmission is believed to indicate that electronic interactions between the electric field of the incident radiation and the metallic film are necessarily operative.

Various embodiments of the present structure provide an average transmission of visible light of at least 60% for a structure having an areal filling fraction of 45%, or a transmission of at least 70% for a filling fraction of 60%, or a transmission of at least 80% for a filling fraction of 75%. In some embodiments, light of wavelengths outside a desired transmission range may be attenuated, i.e., transmitted to an extent less than what would be predicted by the areal filling fraction, even though transmission of light at wavelengths within the desired range are enhanced.

The metallic thin films used in some implementations of the present structure are thicker than the characteristic skin depth for those materials for electromagnetic radiation of visible wavelengths. As understood by a person of ordinary skill, electromagnetic radiation incident on a film is attenuated exponentially with a characteristic decay distance termed the "skin depth." That skin depth is generally understood to be proportional to the square root of wavelength times bulk resistivity. For example, Ag films have a calculated skin depth of about 12 to 15 nm for visible wavelengths. Thus, little to no radiation would be transmitted by a solid conductive metallic film having a thickness of 20 to 200 nm, 20 to 120 nm, or 20 to 80 nm. The ability of the present structure to transmit an appreciable fraction of light incident on it is thus a consequence of the aperture configuration present in the structure.

Some of the possible arrangements of the apertures are shown schematically in FIGS. 1-4. In one preferred arrangement shown in FIG. 1, the apertures are situated at points of a hexagonal, close-packed, completely regular array.

The term "regular, periodic array" is used herein in a manner analogous to its conventional use in crystallography, and refers to an arrangement of points in a two-dimensional space of indefinite extent, wherein all the points (sometimes called "lattice points") in the array (also termed a "lattice") are spatially related, such that a vector connecting any one of the points to any other given point can be represented by the form $(n \cdot \overline{a} + m \cdot \overline{b})$, wherein n and m are integers (positive, negative, or zero) and $\overline{a}$ and $\overline{b}$ are fixed, linearly independent basis vectors in the two-dimensional space, with an angle $\alpha$ between them. In general, $\overline{a}$ and $\overline{b}$ need not be of equal length and $\alpha$ may have any value between 0° and 180°.

In particular, the hexagonal arrangement shown in FIG. 1 can be described using the basis vectors $\overline{a}$ and $\overline{b}$ as illustrated, which are of equal length and oriented with $\alpha = 120°$. The length of basis vectors $\overline{a}$ and $\overline{b}$ thereby determines the nearest-neighbor spacing p in this configuration. It will be understood that FIG. 1 depicts only a portion of an array that extends indefinitely in every direction in the two-dimensional plane. The array is close-packed, meaning that this configuration provides the highest possible areal coverage of a two-dimensional plane by non-overlapping, equally-sized circles. To attain this maximal coverage, a circle having a diameter d equal to the length of the basis vectors is situated at each lattice point. As is apparent from FIG. 1, each such circle is surrounded by six nearest-neighbor circles that form a regular hexagon, with the respective neighbors touching the central circle at 60° intervals around its circumference and each of the hexagonal circles also touching its two adjacent neighbors. Such an arrangement represents an idealized form of a possible configuration of the present conductive structure. In a related and comparable idealized configuration, the circles are similarly arranged, but smaller, so they do not touch their neighbors.

Figure 2A:
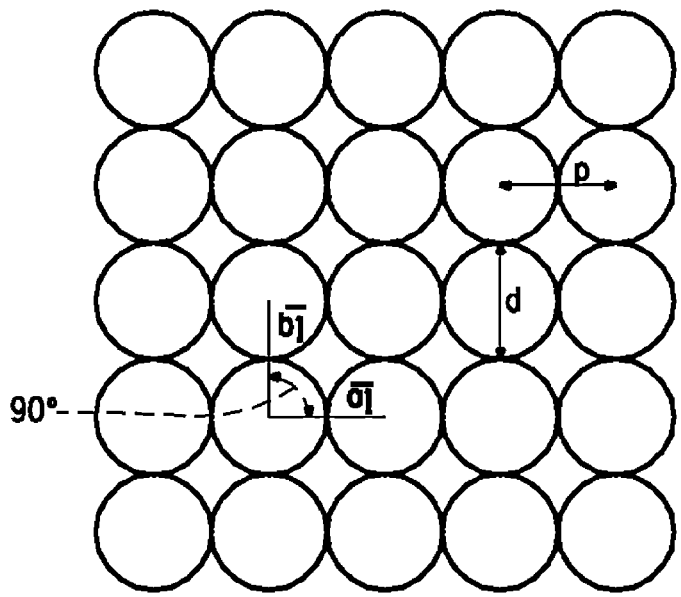
Figure 2B:
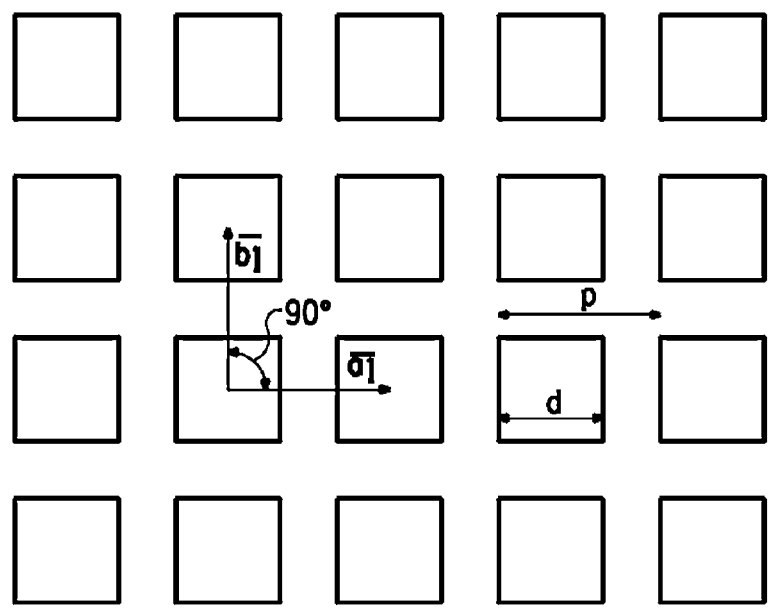
Figure 3:
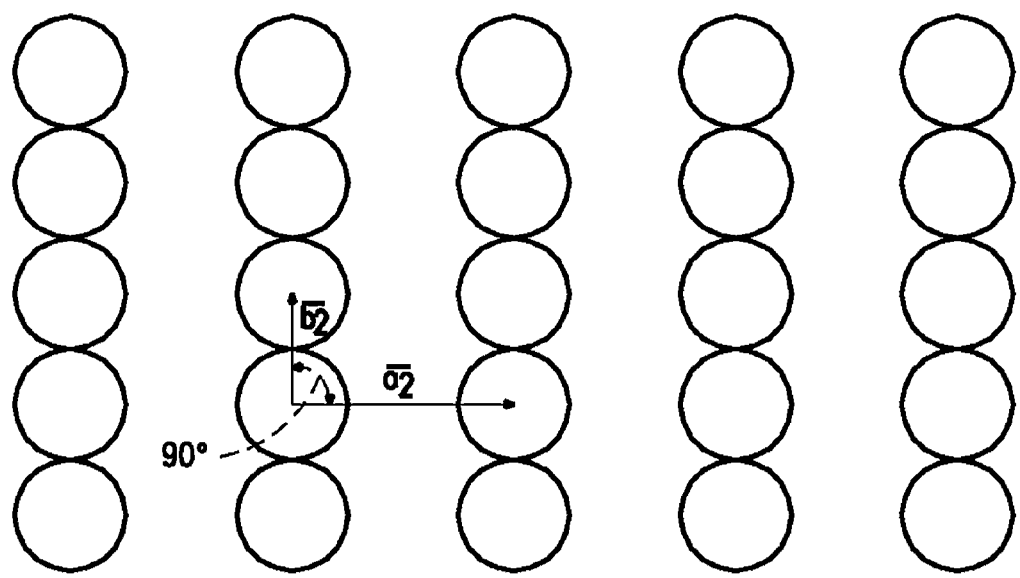
Figure 4:
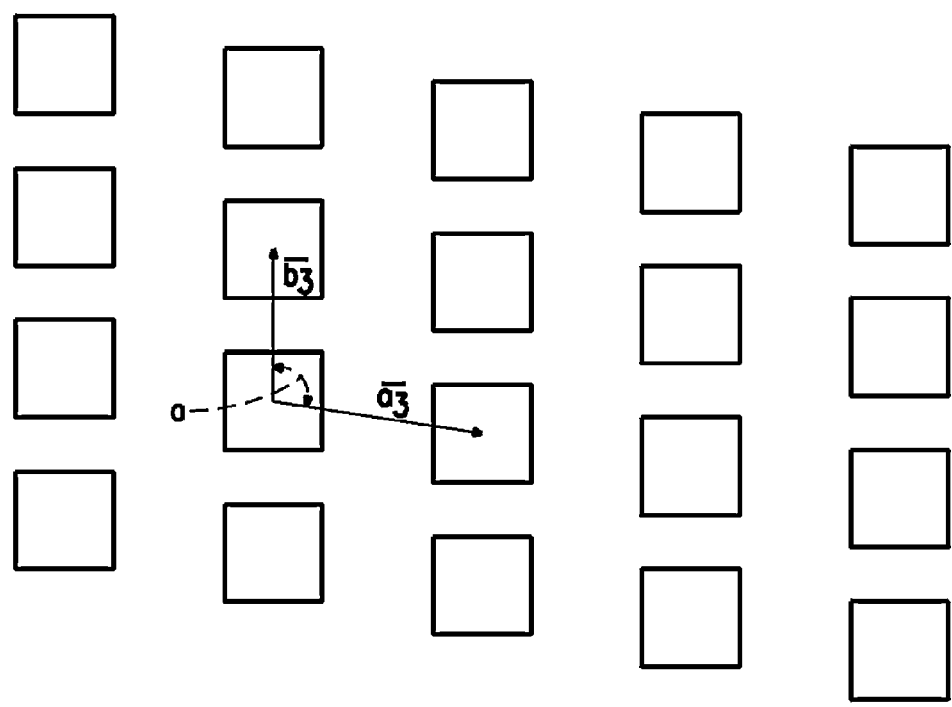

The present thin-film transparent conductive structure can also be formed in configurations other than that of FIG. 1, e.g., ones with apertures arranged in other regular, periodic forms, including, but not limited to, the forms of FIGS. 2A and 2B, wherein the apertures are located at the points of a simple square lattice and are either circular or square-shaped, respectively. A simple square lattice can be described using basis vectors $\overline{a_1}$ and $\overline{b_1}$, which are of equal length and mutually perpendicular ($\alpha = 90°$). Arrangements based on other known regular lattices, such as the rectangular ($\overline{a_2} \neq \overline{b_2}$, $\alpha = 90°$) and oblique ($\overline{a_3} \neq \overline{b_3}$, $\alpha \neq 90°$) lattices of FIGS. 3 and 4, are also possible.

In practice, implementations of the present conductive structure can and will deviate from the idealized forms of the regular lattice arrays described above, and still be described as being based on a regular, periodic array.

For example, in some embodiments, the apertures in the thin-film transparent conductive structure are not all situated in a single regular array that encompasses the entire structure. Instead, and in analogy to a polycrystalline material having individual grains, the arrangement may comprise a plurality of domains or regions, such that within each the apertures are situated in a regular array, but without coherence between the apertures in different domains. In an embodiment, the thin-film transparent conductive structure comprises domains that comprise at least 5, 10, or 20 lattice points or more. The domains in embodiments of this general type may also have an average size of at least 3 μm. Preferably, the domains have an average size that is substantially larger than the wavelength of light for which transparency is sought (e.g., at least 5 to 10 times the wavelength), so that a desirable combination of optical transparency and high electrical conductivity is still attained.

Conductive structures according to the present invention also may be regarded as having apertures that are arranged in a regular and periodic fashion, even if they exhibit some short-range or localized deviations from the idealized structure. For example, there may be a few lattice points in which no aperture is present, and the metallic film instead fills the space. A small number of extra apertures not situated at a lattice point may also be present, as may apertures centered at a location that is slightly displaced from the lattice point. Other types of defects, such as ones analogous to the defects known in crystallography, may also be present.

The present thin-film transparent conductive structure in still other embodiments comprises a plurality of apertures that are situated randomly, instead of being in a regular array. By a random arrangement is meant that the positions of apertures more than a few lattice distances from a reference aperture cannot be necessarily specified by a vector of the form $(n \cdot \overline{a} + m \cdot \overline{b})$, based on any characteristic basis vectors $\overline{a}$ and $\overline{b}$.

Some or all of the foregoing regular, periodic structures may exhibit desirable optical properties, rendering them suitable for one or more applications.

The present conductive structure may also exhibit defects of other types not related to deviations of the aperture positions from the points of a single, regular, periodic lattice. For example, the conductive mesh itself may have localized imperfections, narrowing of the conductive traces, or even local discontinuities or breaks. Such defects may increase the overall sheet resistance slightly, but do not appreciable alter the transmission. In an embodiment, the metallic layer of the present conductive structure has a plurality of apertures having an average size, as measured in the largest dimension, of 250 nm to 2 μm, 250 nm to 1 μm, 300 nm to 700 nm, 250 nm to 425 nm, or 320 nm to 405 nm. The apertures may have an average nearest-neighbor spacing of 300 nm to 2.5 μm, 300 nm to 1.5 μm, 300 nm to 800 nm, 300 to 450 nm, or 400 nm to 450 nm. As used herein, the term "nearest-neighbor spacing" refers to the distance between the center of a given aperture and the center of the aperture closest to it. The term "average nearest-neighbor spacing" refers to the average of such spacings over the entire aperture array. Although circular apertures are readily formed and useful, other shapes, including triangular, square, or other polygonal shapes are also possible.

In an embodiment, the area of the apertures provides an areal filling factor of at least 45%, 60%, or 75%.

In various embodiments, the metallic layer of the present thin-film transparent conductive structure has a thickness of 20 to 200 nm, or 20 to 120 nm, or 20 to 80 nm.

The metallic film forming the mesh-like structure of the present thin-film transparent conductive structure provides continuous conduction paths for the flow of electric current. In theory, the DC sheet resistance $R_s$ of a thin metallic film of thickness t is given by $R_s=\rho/t$, wherein $\rho$ is the bulk DC resistivity of the same material in bulk form. However, it is known that the theoretically attainable values of $R_s$ are not realized in actual solid thin-film materials. Films having thickness of the order of 20 to 200 nm typically exhibit DC sheet resistivities that are 1-2 times the expected value. The DC sheet resistivity of the present structure is further increased by the apertures it contains. In an embodiment, the present structure has a DC sheet resistance of 100 ohms per square ($\Omega/\square$) or less, 50$\Omega/\square$ or less, or 30$\Omega/\square$ or less, or 10$\Omega/\square$ or less. In a related embodiment, the thin-film transparent conductive structure has a combination of a DC sheet resistance of 100 ohms per square ($\Omega/\square$) or less, an average transparency of at least 60%, and a thickness of 20 nm or more.

In contrast, conductive structures employing a conventional indium-tin-oxide conductive layer may have transparency comparable to that of the present structure, but typically have a higher sheet resistivity. For example, a conventional 200 nm-thick ITO film may have an average visible light transparency of ~80% but a sheet resistivity of ~88$\Omega/\square$ The present conductive structure may be formed by any suitable process that provides the required mesh-like structure and apertures having the desired sizes, spacing, and relative arrangement.

Figure 5:
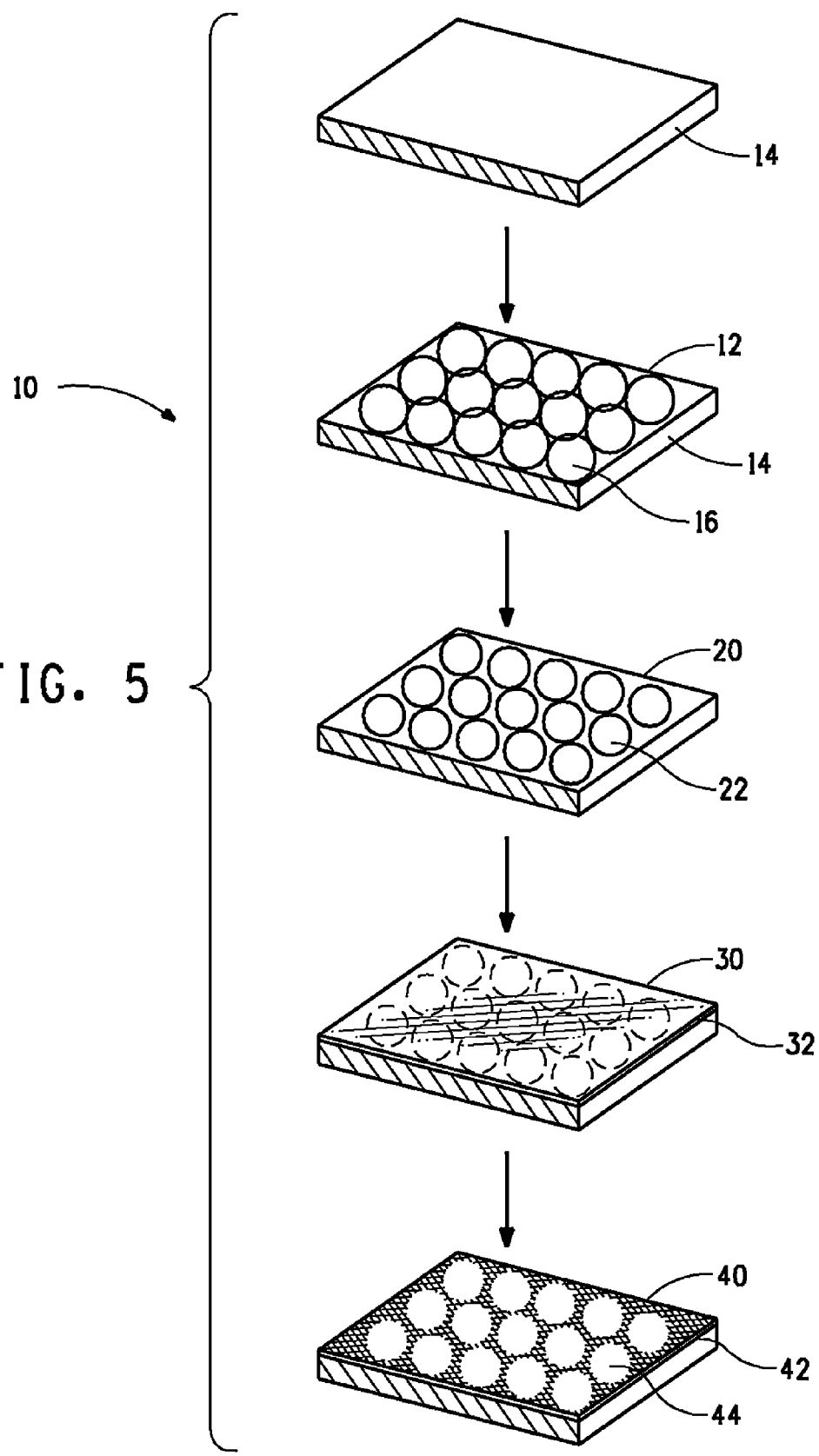
FIG. 5 depicts schematically the steps of a process for preparing a thin-film transparent conductive structure in accordance with the present disclosure.

One possible implementation of a process suitable for fabricating the present thin-film transparent conductive structure is depicted generally at 10 in FIG. 5. First, as shown at 12, a plurality of generally spherical beads 16 having an initial diameter are secured on a first major surface of substrate 14 in the form of a layer in hexagonal, close-packed array. Beads 16 may be made of any material that can be treated to reduce their diameter in a relatively uniform manner. For example, polystyrene beads are suitable and can be shrunk by a reactive ion etching process. As shown at 20, such an etching process is applied to reduce the size of the beads, such that the etched beads 22 remain at their original locations on the substrate, but are then characterized by a reduced diameter. At 30, a metallization layer 32 is deposited onto the first major surface and the etched beads 22 disposed thereon. The metallization can be carried out by any suitable process, including, without limitation, sputtering, evaporation, printing, or any appropriate chemical or physical vapor deposition method. In some embodiments, a thin adhesion layer (not shown) is applied before metallization layer 32. Without limitation, the adhesion layer may have a thickness of 2 nm or less and be comprised of Ti or Cr. It serves to promote strong attachment of metallization layer 32 to substrate 14. At 40, the etched beads 22 and the portion of metallization layer 32 deposited on them are removed, e.g. by sonication, leaving behind a thin-film transparent conductive structure 42 having a plurality of approximately circular apertures or apertures 44, which have a diameter reflecting the reduced bead diameter and are located in positions determined by the configuration in which the beads 16 were originally deposited. For illustrative purposes, the beads 16 shown in FIG. 5 are configured in a hexagonal, close-packed, completely regular array. Such a configuration is readily formed by initially disposing the beads in their closest possible packing, with each bead touching its neighbors. However, it is to be understood that other configurations are also possible.

Figure 6:
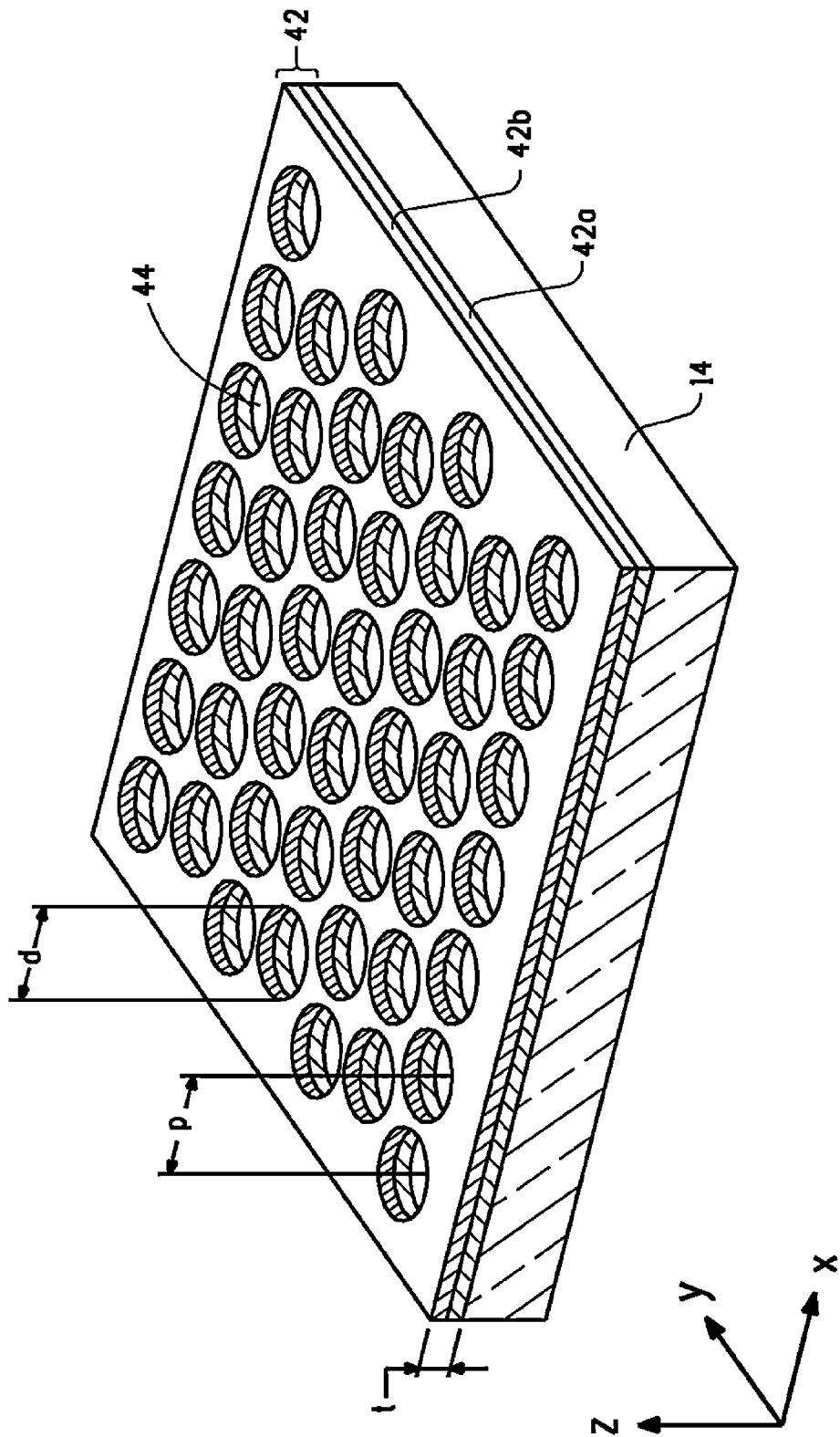
FIG. 6 depicts a thin-film transparent conductive structure in accordance with the present disclosure, wherein the metallic film comprises two sublayers of different metals.

For example, the metalized layer may be comprised of two or more sublayers. FIG. 6 depicts an implementation in which the basic process and configuration of FIG. 5 are maintained, but the metalized layer is formed of two adjacent sublayers 42a and 42b composed of different metals that have an aggregate thickness of t. The sublayers may be deposited by any suitable method, for example sequential evaporation operations. As depicted, sublayers 42a and 42b may have about the same thickness, but this is not required. The aggregate thickness t of the sublayers can assume any of the aforementioned values suitable for single-metal layers. Adjacent sublayers in any of these embodiments may be contiguous or separated by a thin dielectric layer.

Any suitable conductive metal can be used for the metallization layer or for each of the multiple sublayers. In an implementation, the metal is selected from the group consisting of Ag, Cu, Ni, Au, Ti, Cr, Al, and mixtures and alloys thereof. In multiple sublayer configurations, each of the sublayers is composed of a metal selected from said group. In some multiple sublayer configurations, the choice of the metals is such that adjacent layers in the stack are not composed of the same metal. One such multilayer configuration employs two layers, one of Ag and the other of Al. Any of the foregoing multilayer structures can be formed with any of the aperture configurations, sizes, and spacings set forth above for single-metal layer configurations.

In another implementation, the present conductive structure may be formed as a square mesh with square apertures having the requisite size and spacing, as shown in FIG. 2B.

The thin-film, transparent conductive structure can be fabricated on any suitable substrate of metal, polymer, or glass, including both rigid and flexible forms. Ordinarily, the benefit of structure's transparency dictates that it be fabricated on a transparent substrate, but the structure could also be formed on other substrates and still provide conductivity.

Substrates usefully employed include, without limitation, both glasses and the general class of polymeric materials, such as described but not limited to those in *Polymer Materials*, (Wiley, New York, 1989) by Christopher Hall or *Polymer Permeability*, (Elsevier, London, 1985) by J. Comyn. Common examples include polyesters such as polyethylene terephthalate (PET) and polyethylene naphthalate (PEN), polyamides, polyacrylates, polyimides, polycarbonates, polyarylates, polyethersulfones, polycyclic olefins, fluoropolymers such as polytetrafluoroethylene (PTFE), polyvinyl fluoride (PVF), perfluoroalkoxy copolymer (PFA), or fluorinated ethylene propylene (FEP), and the like. Both flexible and rigid forms of these polymers may be used. Many flexible polymer materials are commercially available as film base by the roll. In addition to the transparent conductive metallic layer provided herewith, the substrate may also include other functional coatings used to enhance other optical, electrical, or mechanical properties that are beneficial in an end-use application.

Other processes capable of forming the required conductive structure may also be used, such as photolithography and deposition of the patterned metal using a conductive ink that includes suitable metal particles of any size, including nanoparticles.

A further aspect of the present disclosure provides an electronic device comprising a thin-film, transparent conductive structure. Such a device may be constructed using a thin-film, transparent conductive structure that is separately formed, e.g. on a flexible polymeric substrate which is thereafter integrated in the device. Depending on the device requirements, the thin-film transparent conductive structure can be disposed with either the metallic layer or the carrier substrate in facing relationship with the device. Alternatively, the device itself provides the substrate on which the patterned metallic layer is fabricated directly. Such embodiments facilitate electrical connectivity between the metallic layer and the underlying device. Devices in which the present conductive structure may be incorporated include, without limitation, light-receiving devices such as photovoltaic cells and light-emitting devices such as organic light-emitting devices or displays (OLEDs), touch screen panels, flat-panel displays, and any form of solid state lighting,

EXAMPLES

The operation and effects of certain embodiments of the present invention may be more fully appreciated from a series of examples (Examples 1-13), as described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Example 1

The optical properties of exemplary thin-film transparent conductive structures are predicted by a three-dimensional, finite-difference time-domain (FDTD) computer simulation. In a first configuration, a thin film comprises generally circular apertures having a diameter d that are centered on points of a regular hexagonal lattice with a nearest-neighbor distance p, as representatively depicted in FIGS. 5 and 6. The film is disposed on a glass substrate, which is assumed to be of infinite thickness.

Calculations are done using the computer software package FDTD Solutions (Lumerical Solutions Inc., Vancouver, BC, Canada). For each of the metals considered, literature values of the refractive indices are input. A TE-polarized plane wave is used as the source. To reduce the computational complexity, the configuration is specified with five nearest-neighbor apertures and the solution is required to satisfy periodic boundary conditions. The minimum calculation step in the metal films is limited within 2 nm to ensure adequate resolution in the simulation results. For each material, the average transmittance $T_{avg}$ is calculated by numerical integration over the visible wavelength range 400 to 700 nm, according to equation (1) above.

Figure 7:
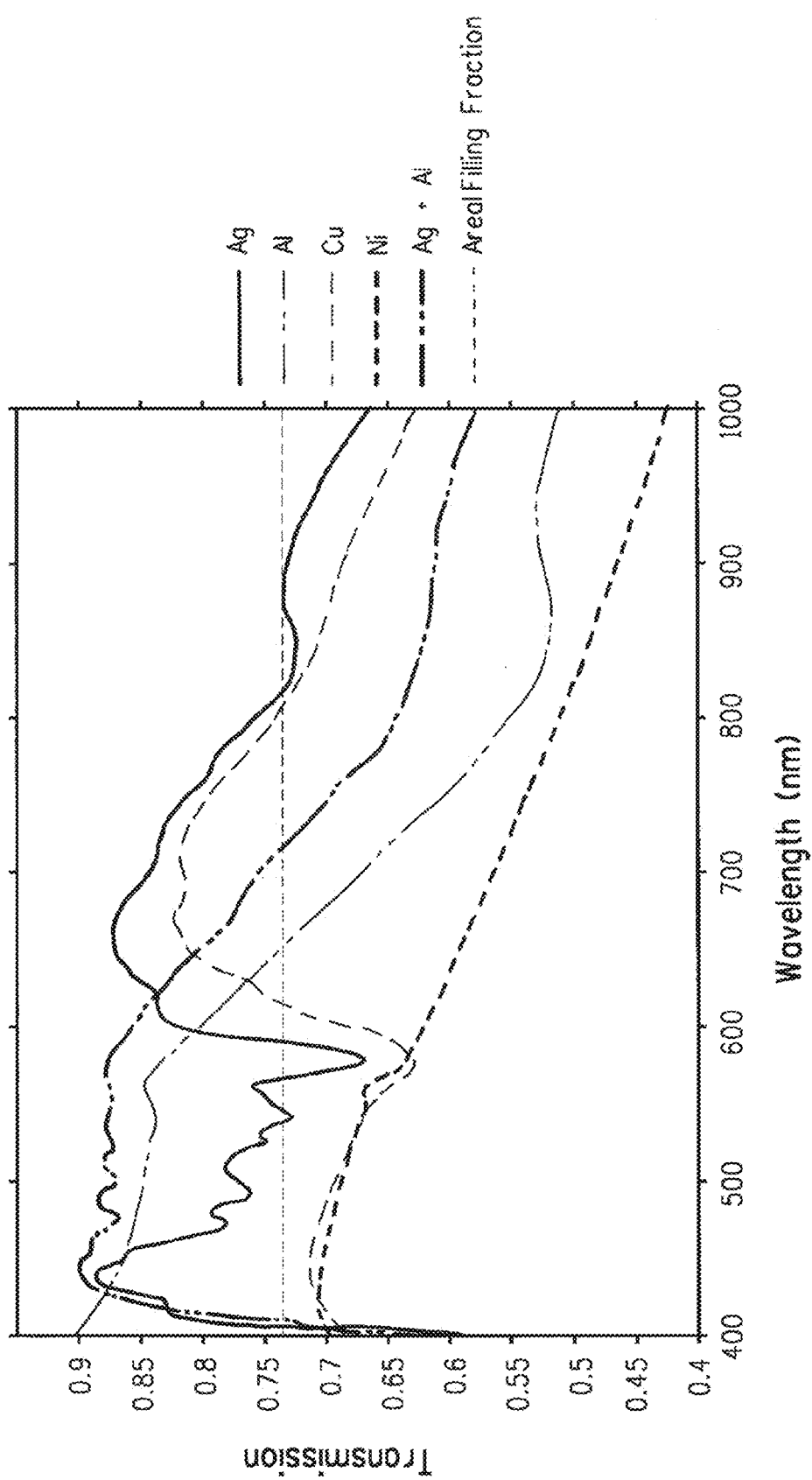
FIG. 7 depicts simulated transmission spectra for thin-film transparent conductive structures comprising different metallic materials and having apertures in a hexagonal close-packed arrangement in accordance with the present disclosure.

FIG. 7 shows simulated spectral responses for structures in the first, hexagonal configuration, wherein p=450 nm, d=409 nm (corresponding to r=d/p=0.9), and t=80 nm, and the metal is Ag, Al, Cu, or Ni. This configuration provides an areal filling fraction of 0.735. The response is also calculated for an 80-nm dual-layer metal film comprising 40 nm of Al on the substrate and 40 nm of Ag atop the Al. Values of the average transmission $T_{avg}$ obtained in these simulations are shown in Table I. Solid thin metal films (i.e., films without apertures) of any of these metals show no appreciable transmission of visible light at 80 nm thickness.

The above simulation is repeated for a second thin-film configuration having generally square apertures situated on points of a regular square lattice having the form depicted by FIG. 2B. The apertures have the same period p, the same ratio r of the hole side d to the period (r=d/p), and the same film thickness t used in the first configuration. This alternative geometry provides an areal filling fraction of about 0.81.

Figure 8:
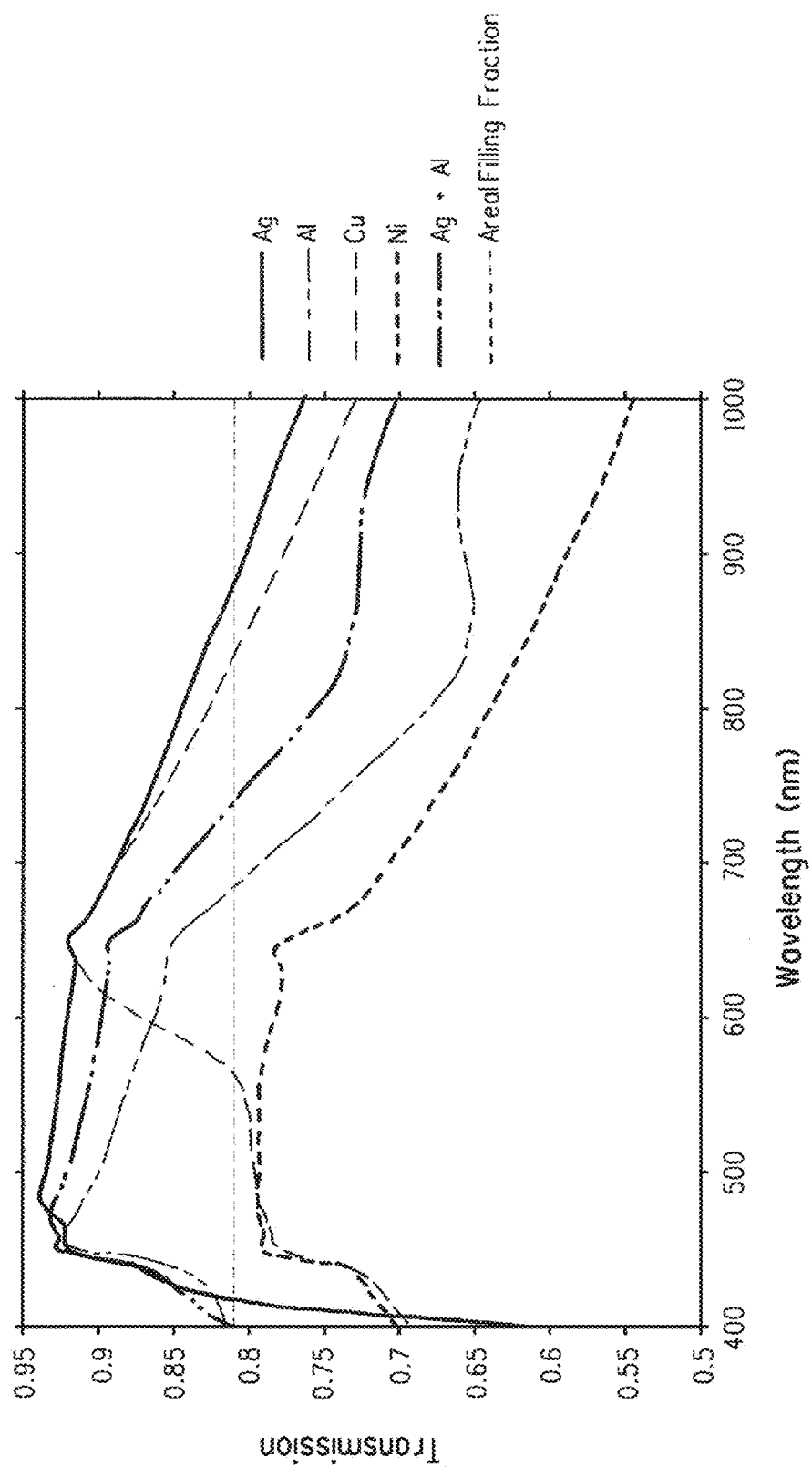
FIG. 8 depicts simulated transmission spectra for structures like those of FIG. 7, but with square apertures in a square array configuration.

The corresponding simulated spectral responses for the same metals in this second, square configuration are calculated using the same methodology. The calculation is again simplified by considering four nearest-neighbor apertures at the vertices of a square and imposing periodic boundary conditions. Results are shown in FIG. 8 and Table I.

These data indicate that the choice of metal results in substantial differences in the simulated behavior in these configurations. In the hexagonal configuration, the Ni film shows little if any effect or enhanced transmission in the visible range, while both Ag and Al films benefit substantially. The Cu film shows some enhancement above about 650 nm and into the near-IR regime. The same general trends are seen in the square configuration, though the curves show somewhat less variability as a function of wavelength.

Significantly, the film having discrete sublayers of Ag and Al shows a higher average transmission in the hexagonal configuration than films containing the same total thickness of either metal separately. The results in FIGS. 7 and 8 suggest that in the multilayer structure the transmission of Al in the range of about 400-600 nm more than compensates for the depression in the Ag transmission in this range.

TABLE I

Transmission of Visible Light Through Structured Films Having Apertures in Hexagonal and Square Configurations

| | Visible Transmission | |
|---|---|---|
| Metal | Hexagonal | Square |
| Al | 0.838 | 0.867 |
| Ag | 0.798 | 0.892 |
| Cu | 0.704 | 0.794 |
| Ni | 0.669 | 0.765 |
| Ag/Al | 0.845 | 0.890 |

Example 2

Figure 9:
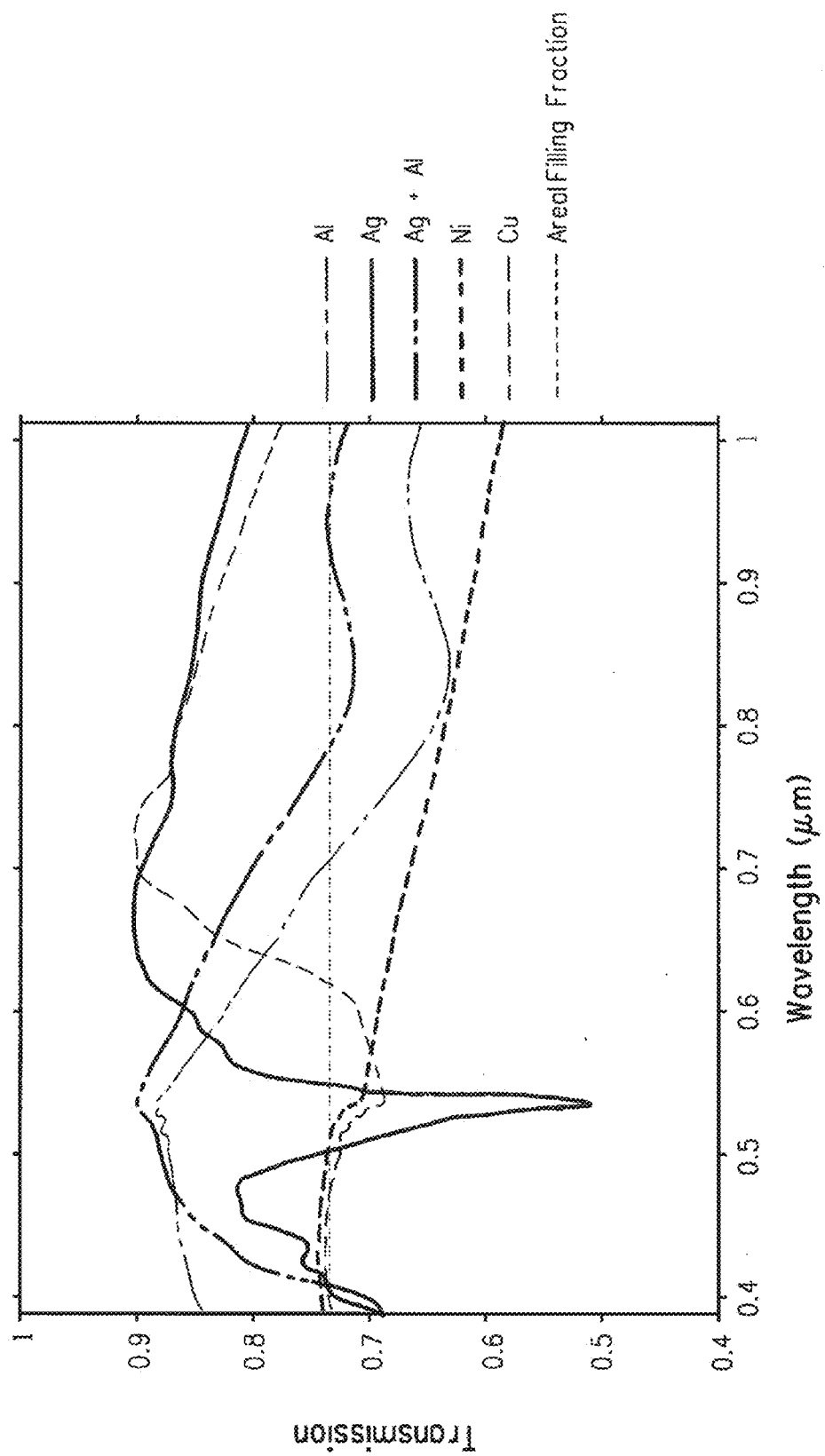
FIG. 9 depicts simulated transmission spectra for structures like those of FIG. 7, but with aperture periodicity.

The simulations done in Example 1 are carried out using a slightly modified hexagonal configuration having p=420 nm, r=0.9, and t=40 nm, which again yields an areal filling fraction of 0.735. The simulation results depicted in FIG. 9 for metallic films of Al, Ag, Cu, Ni, and an Ag/Al multilayer (20 nm each) indicate the same trends seen in FIGS. 7 and 8, with the multilayer exhibiting better broadband performance than 40 nm of either single material.

Example 3

Figure 10:
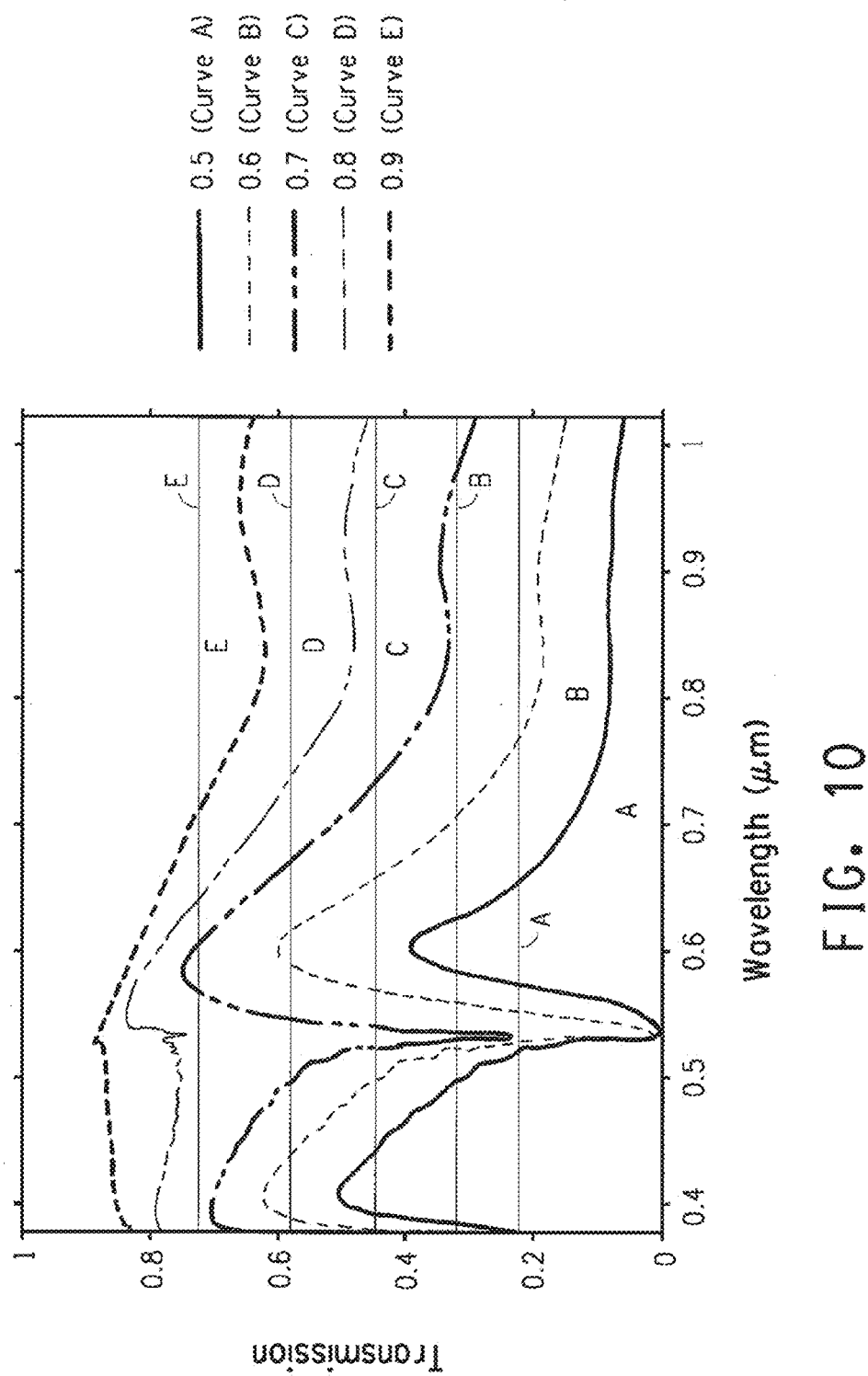
FIGS. 10-11 depict simulated transmission spectra for structures having Al and Ag metallic layers, respectively, and with varying aperture size at a fixed aperture periodicity.
Figure 11:
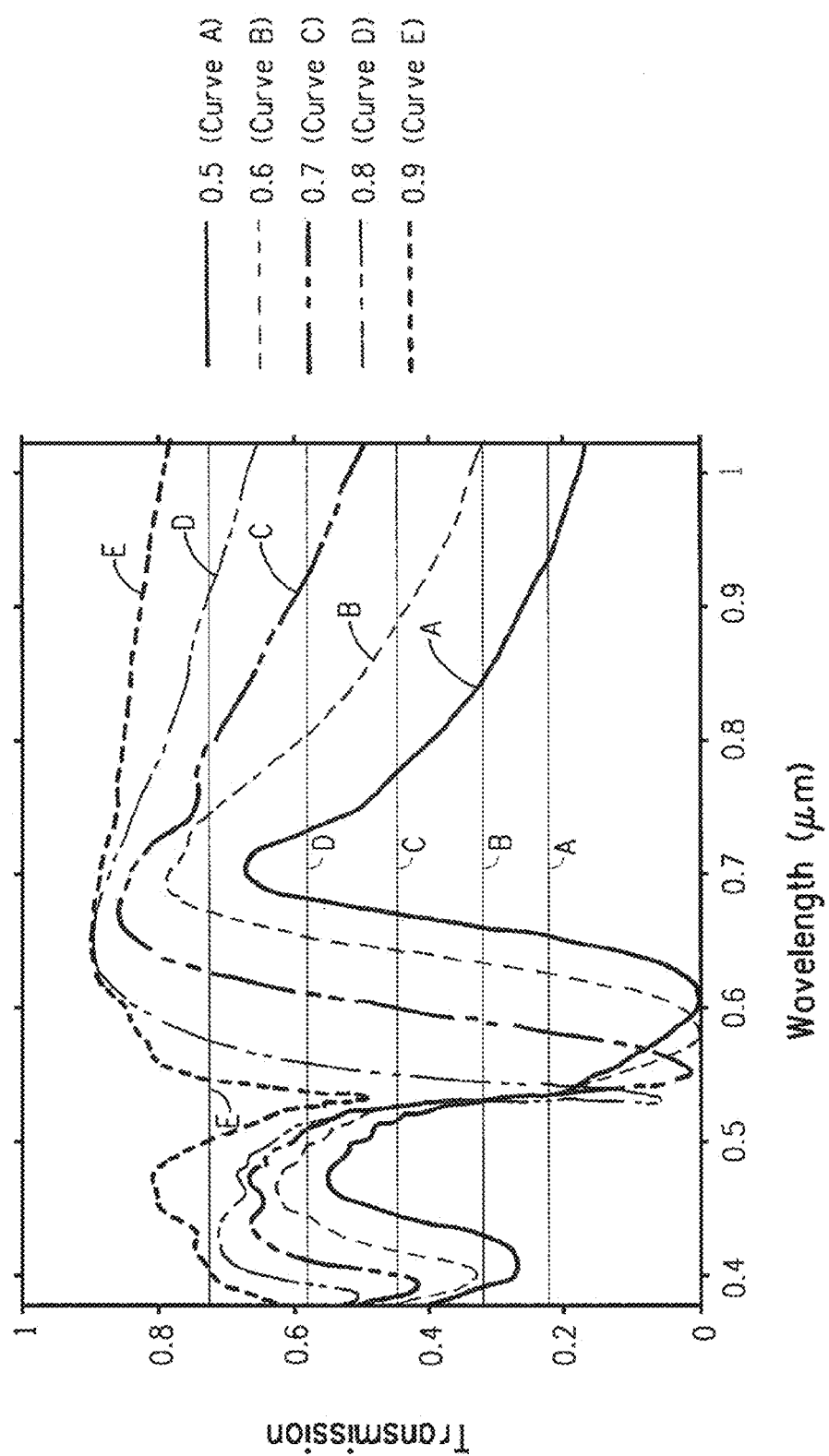

The results of Example 2 are further extended by varying the ratio r=d/p from 0.5 to 0.9, with p=420 nm and t=40 nm being fixed. Simulation results for conductive structures with Al and Ag metal layers and hexagonal, close-packed apertures, are depicted in FIGS. 10 and 11, respectively, with r=0.5, 0.6, 0.7, 0.8, and 0.9 for each. FIGS. 10 and 11 further include horizontal lines depicting the areal filling fraction for the configuration at each value of r.

Example 4

Figure 12:
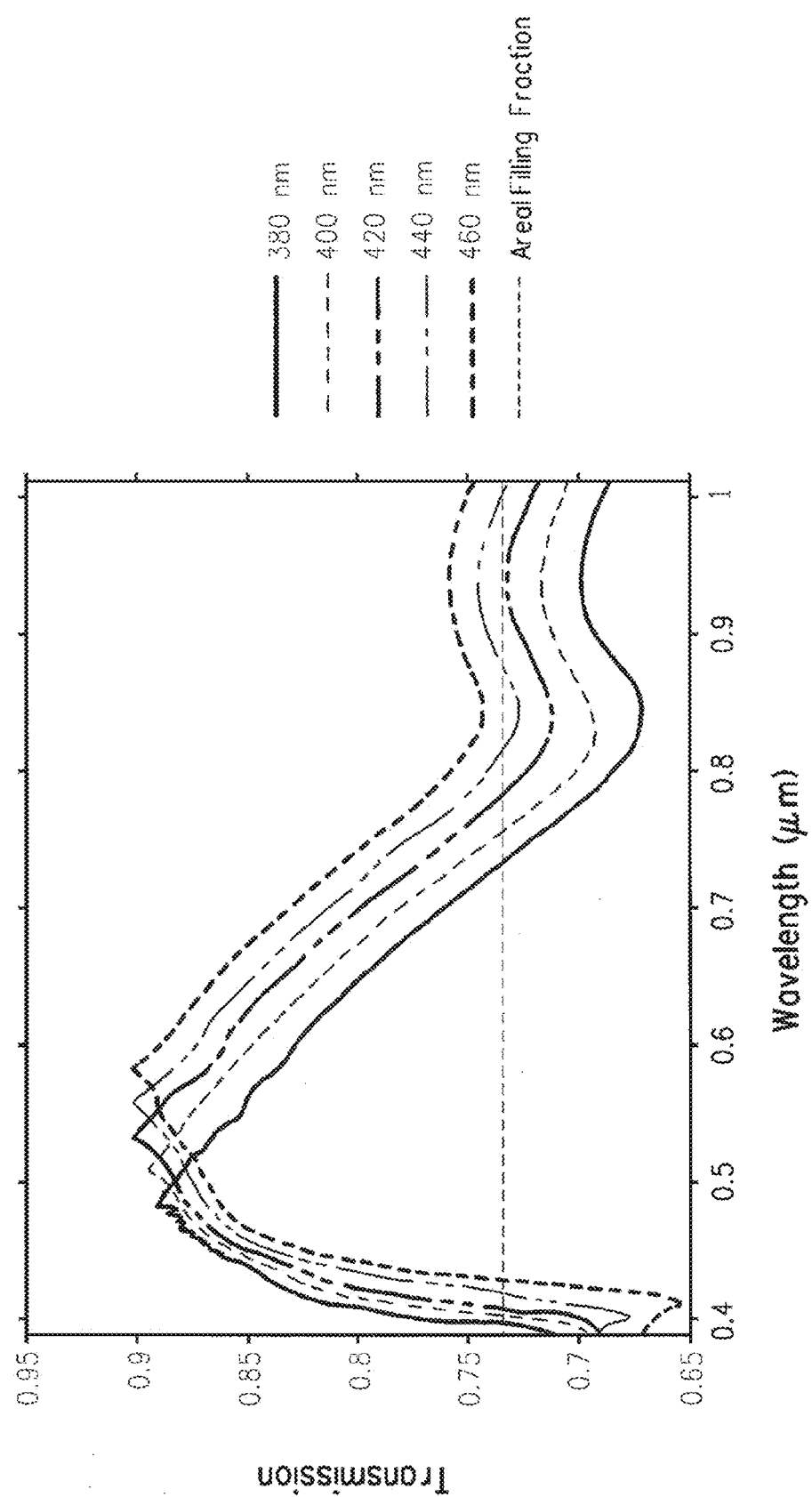
FIG. 12 depicts simulated transmission spectra like those of FIG. 7, but with different aperture spacing.

Additional simulation results are obtained using the same methods employed for Examples 1-3, with a stacked, patterned film of having two 20 nm-thick sublayers of Ag and Al (t=40 nm total), fixed r=0.9, and with p varying from 380 to 460 nm. As is apparent from FIG. 12, these simulations indicate that such structures exhibit transmission that is enhanced over the areal filling fraction of 0.735 (horizontal line in FIG. 12) over virtually the entire visible wavelength range, with peak transmission shifting slightly toward longer wavelengths as p increases.

Example 5

Figure 13:
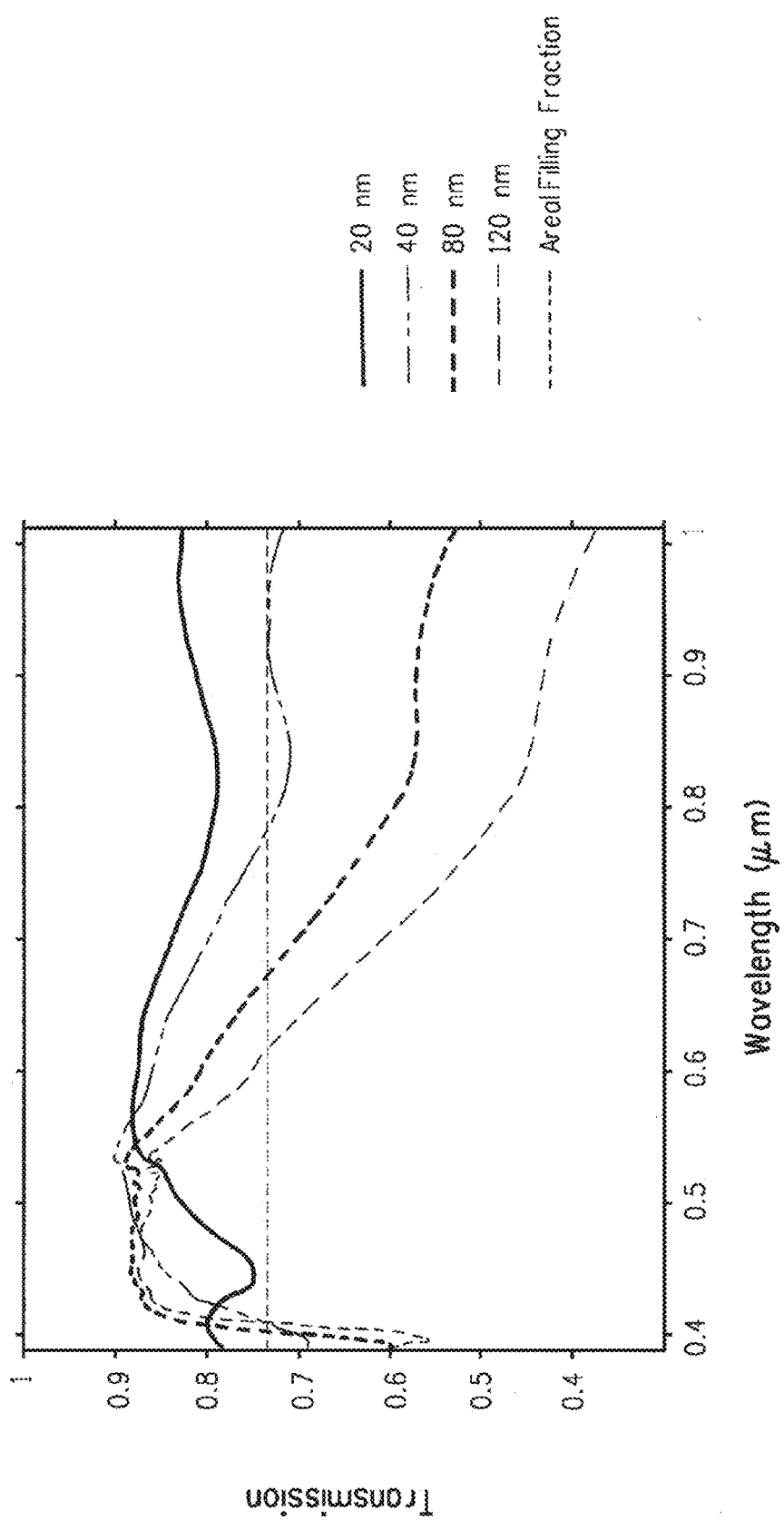
FIG. 13 depicts simulated transmission spectra like those of FIG. 7, but with different film thicknesses.

The effect of metal film thickness is studied for a stacked, patterned film of Ag/Al, with total thickness of 20-120 nm, and a hexagonal close-packed aperture configuration with constant p=420 nm and r=0.9. The simulated transmission spectra, calculated using the same techniques employed for Examples 1-4, are shown in FIG. 13, along with a horizontal line showing the areal filling fraction of 0.735. The results indicate that the highest average transmission is seen for 40 and 80 nm films. The visible transmission minimum seen for the 20 nm film is largely suppressed at higher thicknesses, while the reduction on the red end of the spectrum becomes more pronounced as thickness increases above 80 nm.

Example 6

Figure 14:
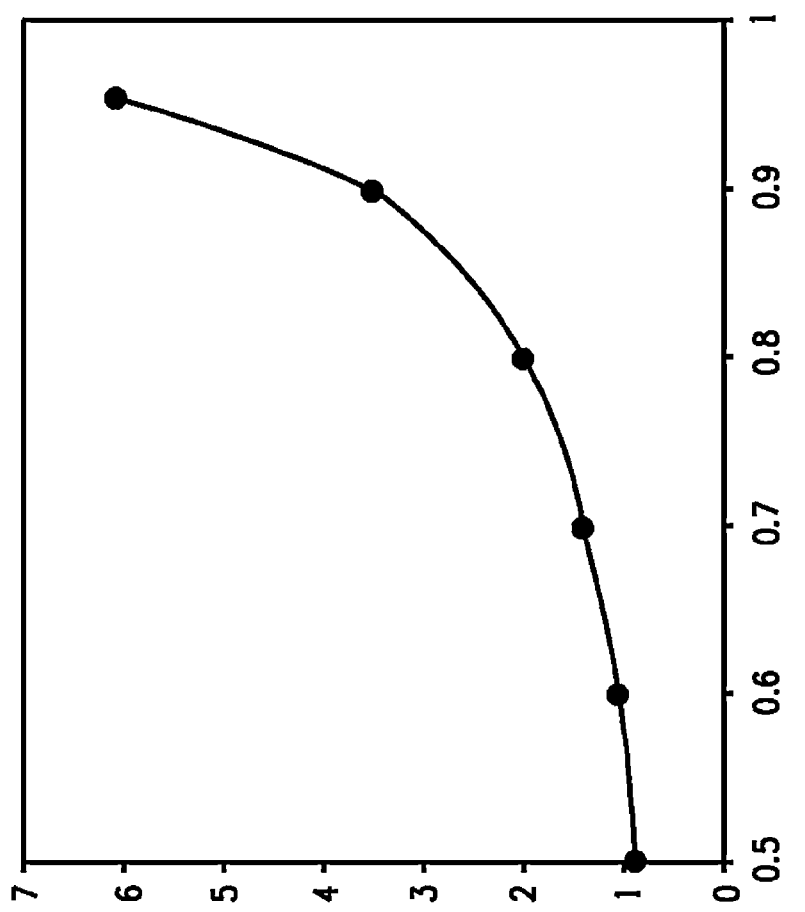
FIG. 14 depicts the calculated sheet resistance for thin-film transparent conductive structures in accordance with the present disclosure, as a function of the ratio of aperture size to aperture periodicity.

The DC sheet resistance of the present patterned conductive structure is predicted by a finite element computation as a function of the areal filling fraction. The calculation is carried out using the computer software package COMSOL Multiphysics® (COMSOL, Inc., Burlington, Mass.) using a hexagonal configuration of the type depicted by FIG. 3. FIG. 14 depicts the calculated sheet resistance for a Ag/Al multilayer structure with total thickness t=40 nm and values of r varying from 0.5 to 0.95. For a constant thickness, sheet resistance is expected to depend only on the material (assumed to have its bulk resistivity and r (=d/p), but not separately on p. As expected, the resistance decreases as r decreases, since more metal is available to conduct current.

Example 7

Figure 15:
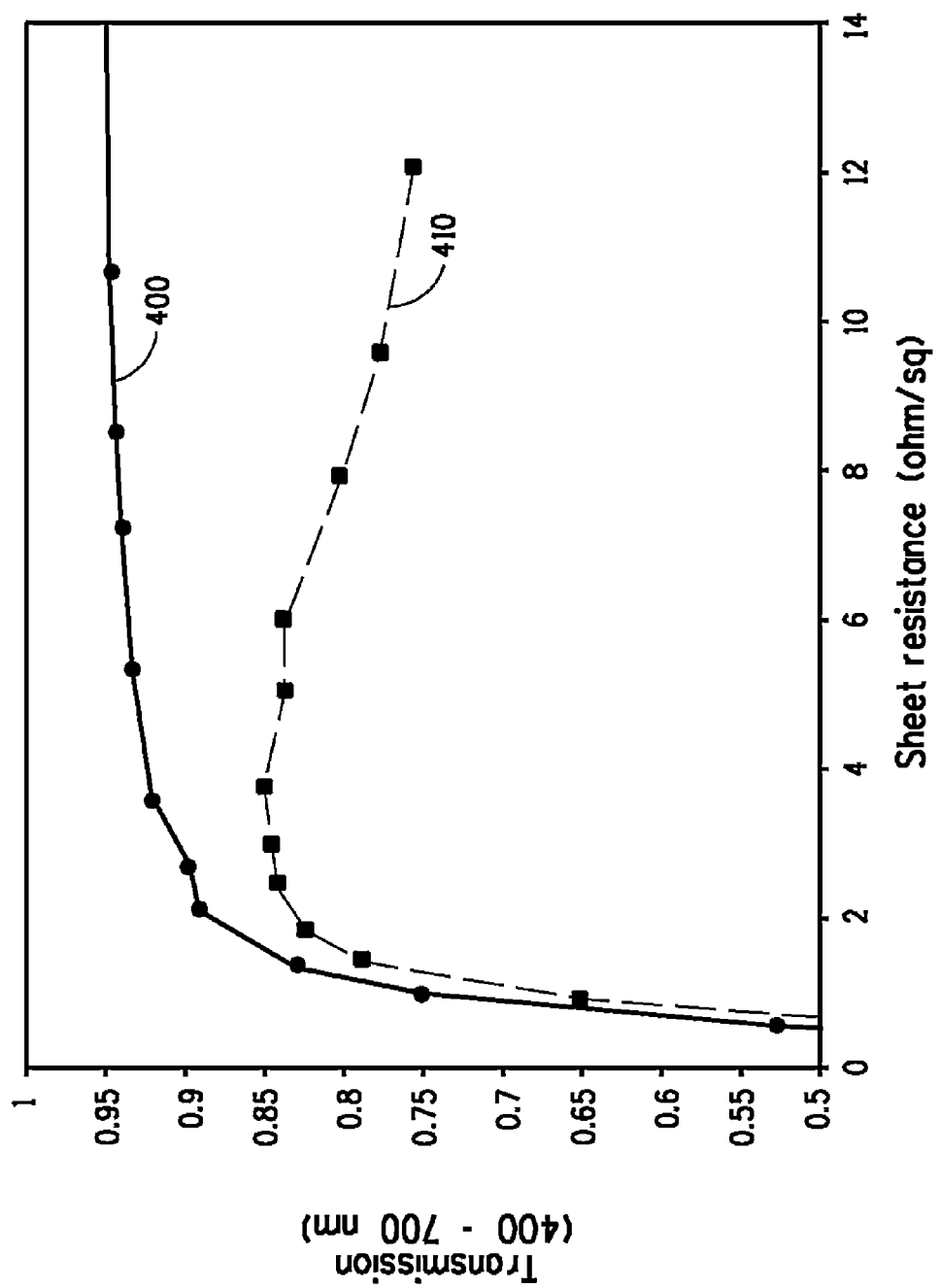
FIG. 15 depicts the calculated relationship between sheet resistance and transparency for thin-film transparent conductive structures in accordance with the present disclosure, for varying aperture sizes at constant aperture periodicity.

A series of simulation experiments is carried out on thin-film transparent conductive structures to determine both average transparency in the visible range and sheet resistivity. The methodologies used in Examples 1-5 to calculate transparency and in Example 6 to determine sheet resistivity are applied to Al films having circular apertures in a hexagonal configuration and Ag films having square apertures in a square configuration. The film thickness t and period p are held constant at 80 nm and 450 nm, respectively, with the areal filling fraction adjusted by varying the aperture dimension d. FIG. 15 is a plot showing the relationship between resistance and transparency for the simulated Ag (line 400) and Al (line 410) configurations. It is significant that relatively high transparency (e.g., 80% or more) can be attained with minimal increase in sheet resistance above the level exhibited by a solid conductive film.

Example 8

Figure 16:
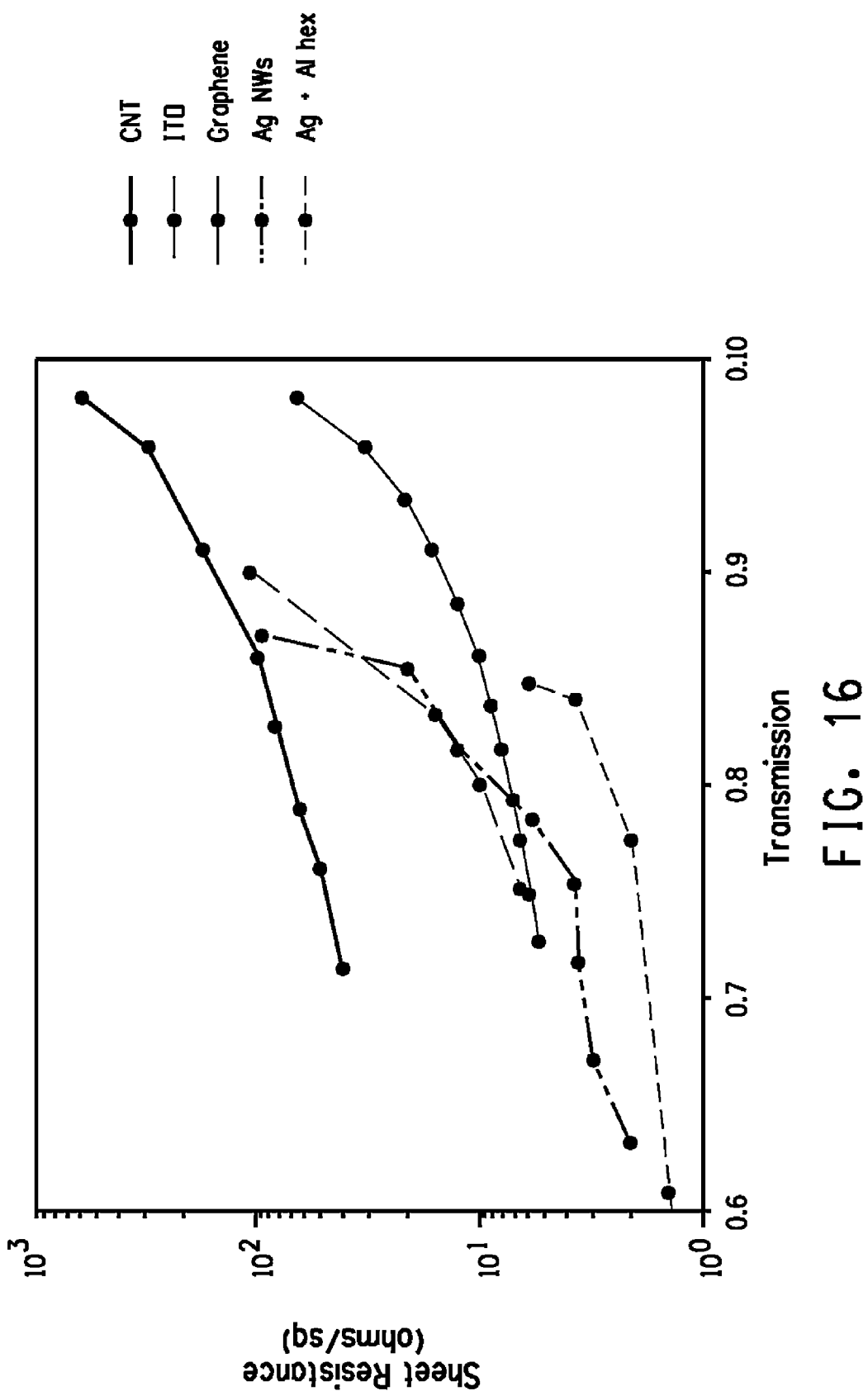
FIG. 16 depicts the relationship between sheet resistance and transparency for different thin-film transparent conductive structures in accordance with the present disclosure.

The simulation experiments of Example 7 are extended to a structure comprising a two-layer Ag/Al film (40 nm of each metal) having circular apertures in a hexagonal configuration. As in Example 7, the methodologies used in Examples 1-5 to calculate transparency and in Example 6 to determine sheet resistivity are again employed. The aperture period p is held constant at 420 nm, with the areal filling fraction adjusted by varying the aperture dimension d. FIG. 16 is a plot showing the relationship between resistance and transparency for the various simulated Ag/Al configurations. Also depicted are experimental results for known transparent conductive films comprising carbon nanotubes (CNT, H.-Z. Geng, et al. J. Am. Chem. Soc. 129, 7758-7759 (2007)) and Ag nanowires (Ag NWs, L. Hu et al., Scalable coating and properties of transparent, flexible, silver nanowire electrodes, ACS Nano, 4(5), 2955-63 (2010)); and calculated values for ITO and graphene structures (S. Bae et al., Roll-to-roll production of 30-inch graphene films for transparent electrodes. Nature Nanotechnology, 5(8), 574-8 (2010)).

It is seen that the present thin-film transparent conductive structure is predicted to exhibit low calculated resistance and high average visible transparency, in combinations not attained by any of the prior art conductive materials.

Examples 9-13

A series of thin-film transparent conductive structures having generally circular apertures in a regular, hexagonal close-packed configuration were prepared in accordance with the invention. The apertures had approximate diameters d and periodicity p and calculated values of r=d/p and aperture areal filling fraction, as listed in Table II. Examples 9 and 10 were prepared with single Ag films having thickness of 20 and 40 nm, respectively, while Examples 11-13 had films with two adjacent sublayers, a first Al sublayer deposited on the substrate and a second Ag sublayer on top of the Al sublayer.

TABLE II

Physical and Optical Properties of Thin-Film Transparent Conductive Structures

| Example No. | Film Thickness (Ag/Al) (nm/nm) | Hole Diameter (d, nm) | Hole Periodicity (p, nm) | r (=d/p) | Areal Filling Fraction (%) | Avg. Transmission (%) | Sheet Resistivity (Ω/□) |
|---|---|---|---|---|---|---|---|
| 9 | 20/0 | 300 | 420 | 0.714 | 43 | 68 | 33 |
| 10 | 40/0 | 330 | 420 | 0.786 | 56 | 66 | 16 |
| 11 | 20/20 | 330 | 420 | 0.786 | 56 | 58 | 39 |
| 12 | 10/10 | 330 | 420 | 0.786 | 56 | 73 | 40 |
| 13 | 10/10 | 320 | 420 | 0.762 | 52 | 68 | 37 |

Each of the thin-film transparent conductive structures of Examples 9-13 was prepared as follows. First, using a floatation technique, a single layer of polystyrene beads (~420 nm average diameter) was prepared in hexagonal, close-packed array on a 2.5×5 cm glass slide. An 8 vol. % dispersion of the beads in water was diluted 2:1 with ethanol and stirred on a vortex stirrer. The solution was carefully added on top of water filling a 7.5 cm crystallization dish until the surface was nearly covered. The beads were urged into a smaller area by floating two strips of PTFE tape on the liquid surface and drawing the strips together manually. A clean glass slide was then gently submerged and withdrawn from the crystallization dish with its surface approximately flat, so that a single layer of the beads remained. The slide was then propped vertically on a lint-free cloth and allowed to dry in air, thereby adhering a single layer of the beads to the substrate in a regular, hexagonal close-packed configuration in which the nearest-neighbor distance and thus, the lattice periodicity, was established by the bead diameter of ~420 nm.

Second, a reactive etching process was carried out in an oxygen plasma chamber (Semi Group RIE Etcher) to reduce the bead diameter to a desired value, while maintaining the configuration of the beads' centers on the glass slide. The process was operated at a flow rate of ~35 sccm $O_2$ and ~1.4 sccm Ar, 60 W power, and a throttle pressure of ~60 mTorr (~8 Pa). It was determined experimentally that under these conditions, the decrease in diameter proceeded linearly with etching time. The samples were exposed for varying times to obtain different reduced diameters.

Third, a thin film of the desired metal or metals was deposited by an electron beam evaporation technique carried out in a Leybold Model L560 E-beam evaporator operated at a vacuum level of $10^{-5}$-$10^{-6}$ torr with a deposition rate of ~0.1 nm/sec. For Examples 9 and 10, a single layer of Ag having a thickness of 20 or 40 nm, respectively, was deposited so that it covered both the beads and the surrounding areas on the entire substrate. For Examples 11-13, sublayers of Al and Ag were deposited sequentially using the same techniques, producing sublayer thicknesses of 20 nm/20 nm and 10 nm/10 nm as stated in Table II.

Finally, the metal-coated beads were removed by sonicating the entire structure in methanol for 1 min. SEM examination revealed that the beads were nearly completely removed, leaving behind a conductive mesh disposed on the glass slide substrate. The structures included an array of apertures having an average size approximately equal to the diameter of the beads as reduced during the treating step and before sonication.

Figure 17A:
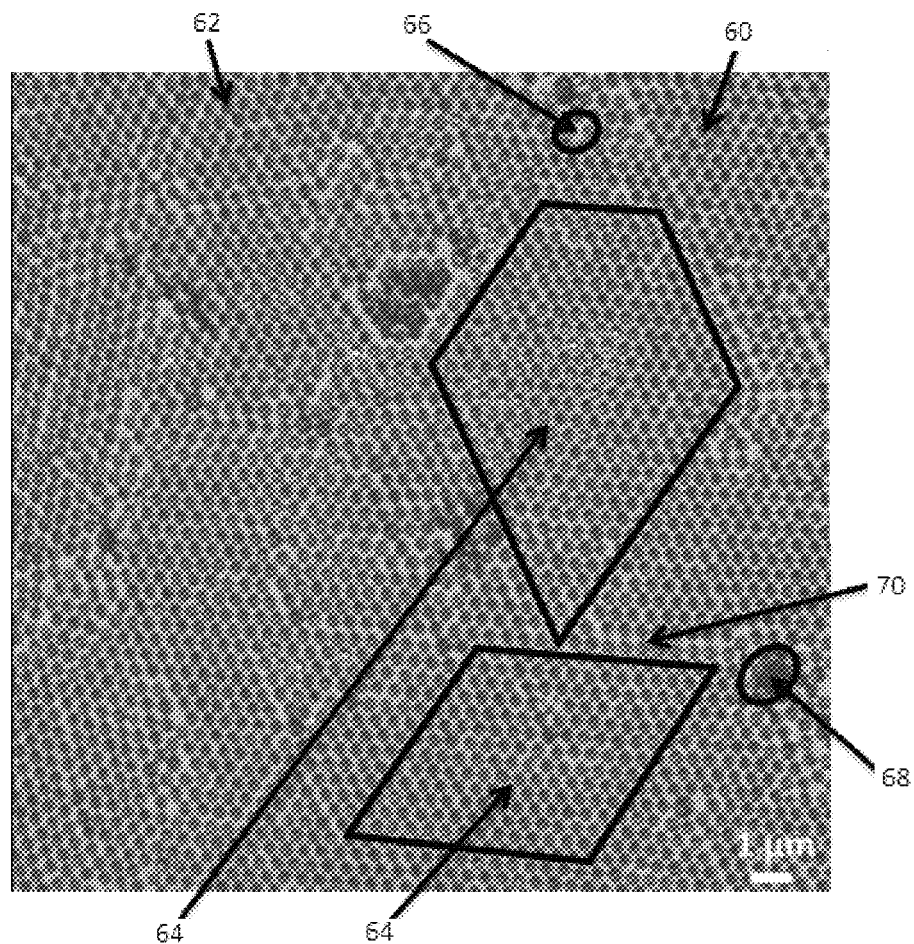
FIGS. 17A and 17B are AFM and SEM images, respectively, of a thin-film transparent conductive structure fabricated in accordance with the present disclosure.
Figure 17B:
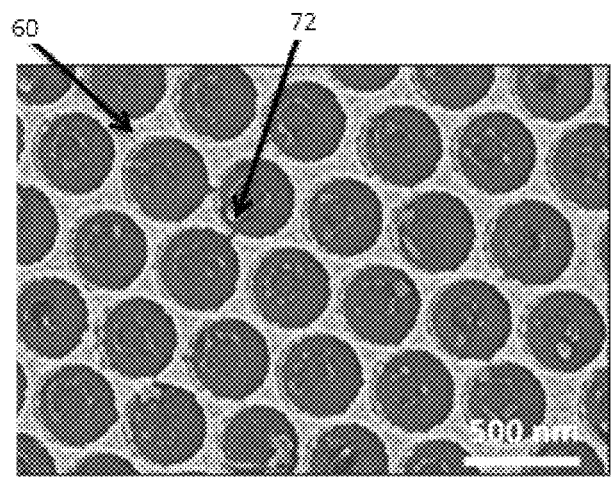

Atomic force microscopy (AFM) and scanning electron microscopy (SEM) images of the thin-film transparent conductive structure of Example 11 are provided in FIGS. 17A and 17B, respectively, as representative of Examples 9-13. The thin-film transparent conductive structure is shown generally at 60. The AFM image reveals the presence of representative defects typical of those found in actual thin-film transparent conductive structures of the invention.

The structure is predominantly composed of a plurality of domains, such as regions 64 (delineated by a solid boundary line) shown in FIG. 17A. Each such domain contains apertures 62 that are in a hexagonal, close-packed configuration extending over many times the nearest-neighbor distance. Within such a domain, there frequently exist local defects, such as the vacancy of region 66 or the presence of excess holes, as in region 68 (also delineated by solid boundary lines). Line defects, such as the dislocation in region 70, are often found in the boundary region between domains. Ordinarily, there is no coherence between the positions of the apertures in different domains. The AFM image additionally shows small defected regions in which the local configuration is not regular. Despite the presence of these defects, the structure may still be regarded as having a regular, hexagonal close packed configuration, as described above. The SEM image of FIG. 17B also reveals the presence of some polystyrene residue 72 in the mesh apertures, which would be expected to slightly reduce the observed optical transmission.

Electrical and optical characteristics of the thin-film transparent conductive structures of Examples 9-13 were measured. DC sheet resistance was determined in a conventional manner from the slope of a 4-probe voltage/current trace measured using an Agilent Model 4155C Semiconductor Parameter Analyzer 4155C. Transmission spectra were obtained using a UV-1700 UV-VIS spectrophotometer (Shimadzu Scientific Instruments, Columbia, Md.). An average transmission $T_{avg}$ of visible light (400-700 nm wavelength range) was calculated for each structure from its experimental spectrum in accordance with equation (1) above. Table II sets forth the resulting data. It may be seen that each structure exhibits enhanced transmission, as indicated by the value of $T_{avg}$ being higher than the corresponding areal filling fraction. The highest transmission is obtained with Example 12, a 10 nm/10 nm Ag/Al bilayer film.

Having thus described the invention in rather full detail, it will be understood that this detail need not be strictly adhered to but that further changes and modifications may suggest themselves to one skilled in the art, all falling within the scope of the invention as defined by the subjoined claims.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value; and (b) all numerical quantities of parts, percentage, or ratio are given as parts, percentage, or ratio by weight; the stated parts, percentage, or ratio by weight may or may not add up to 100.

What is claimed is:

1. A thin-film transparent conductive structure comprising:
   (a) a substrate; and
   (b) a metallic layer disposed on the substrate and having therein an array of a plurality of apertures having an average size of 250 nm to 425 nm as measured in the largest dimension and an average nearest-neighbor spacing of 300 nm to 450 nm, and
   wherein the metallic layer has thickness of 20 nm to 120 nm and a DC sheet resistance of 100 ohms per square or less, the apertures define an areal filling fraction of at least 45%, and the thin-film transparent conductive structure exhibits an enhanced transmission of at least 60%, as measured over a range of wavelengths from 400 nm to 700 nm.

2. The thin-film transparent conductive structure of claim 1, wherein the metallic layer is comprised of a metal selected from the group consisting of Ag, Cu, Ni, Au, Ti, Cr, Al, and mixtures and alloys thereof.

3. The thin-film transparent conductive structure of claim 2, wherein the metallic layer is comprised of Ag.

4. The thin-film transparent conductive structure of claim 1, wherein the metallic layer comprises a plurality of metallic sublayers, each being composed of a metal selected from the group consisting of Ag, Cu, Ni, Au, Ti, Cr, Al, and mixtures and alloys thereof.

5. The thin-film transparent conductive structure of claim 4, wherein the metallic layer comprises exactly two metallic sublayers that are composed of different metals.

6. The thin-film transparent conductive structure of claim 4, wherein the metallic layer consists essentially of an Ag sublayer and an Al sublayer.

7. The thin-film transparent conductive structure of claim 1, wherein the average size of the apertures is 320 nm to 405 nm.

8. The thin-film transparent conductive structure of claim 1, wherein the average nearest-neighbor spacing is 400 nm to 450 nm.

9. The thin-film transparent conductive structure of claim 1, wherein the array is a regular, close-packed array.

10. The thin-film transparent conductive structure of claim 1, wherein the apertures have a circular shape.

11. An electronic device comprising the thin-film transparent conductive structure of claim 1.

12. A photovoltaic device comprising the thin-film transparent conductive structure of claim 1.

13. An OLED device comprising the thin-film transparent conductive structure of claim 1.

14. A thin-film transparent conductive structure comprising:
    (a) a substrate; and
    (b) a metallic layer disposed on the substrate and having therein an array of a plurality of apertures having an average size of 250 nm to 2 µm as measured in the largest dimension and an average nearest-neighbor spacing of 300 nm to 2.5 µm, the metallic layer comprising a plurality of metallic sublayers, each being composed of a metal selected from the group consisting of Ag, Cu, Ni, Au, Ti, Cr, Al, and mixtures and alloys thereof, and
    wherein the thin-film transparent conductive structure exhibits an enhanced transmission as measured over a range of wavelengths from 400 nm to 700 nm and a DC sheet resistance of 100 ohms per square or less.

15. The thin-film transparent conductive structure of claim 14, wherein the metallic layer consists essentially of an Ag sublayer and an Al sublayer.

16. The thin-film transparent conductive structure of claim 14, wherein the average size is 250 to 425 nm as measured in the largest dimension and the average nearest-neighbor spacing is 300 nm to 450 nm.

17. The thin-film transparent conductive structure of claim 14, wherein the metallic layer has thickness of 20 nm to 200 nm.

18. The thin-film transparent conductive structure of claim 14, wherein the metallic layer has thickness of 20 nm to 120 nm.

* * * * *